(12) United States Patent
Okandan et al.

(10) Patent No.: US 8,895,364 B1
(45) Date of Patent: Nov. 25, 2014

(54) STRUCTURED WAFER FOR DEVICE PROCESSING

(71) Applicant: Sandia Corporation, Albuquerque, NM (US)

(72) Inventors: Murat Okandan, Edgewood, NM (US); Gregory N. Nielson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/243,665

(22) Filed: Apr. 2, 2014

Related U.S. Application Data (62) Division of application No. 13/239,181, filed on Sep. 21, 2011, now Pat. No. 8,729,673.

(51) Int. Cl.
*H01L 29/06* (2006.01)
*H01L 21/78* (2006.01)
*H01L 21/762* (2006.01)

(52) U.S. Cl.
CPC .......... *H01L 21/78* (2013.01); *H01L 21/76251* (2013.01)
USPC .......................................... 438/113; 257/618

(58) Field of Classification Search
CPC ..... H01L 21/50; H01L 21/78; H01L 21/6836; H01L 21/68327; H01L 21/02002
USPC .................. 438/113, 460–465; 257/E21.499, 257/E21.599, 618, 774
See application file for complete search history.

(56) References Cited

U.S. PATENT DOCUMENTS

| | | | | |
|---|---|---|---|---|
| 6,777,267 | B2 * | 8/2004 | Ruby et al. | 438/113 |
| 8,236,611 | B1 | 8/2012 | Anderson et al. | |
| 2006/0068567 | A1 | 3/2006 | Beyne et al. | |
| 2009/0194787 | A1 * | 8/2009 | Liang | 257/183 |
| 2010/0330506 | A1 | 12/2010 | Knechtel | |
| 2014/0084450 | A1 * | 3/2014 | Nielson et al. | 257/734 |

* cited by examiner

*Primary Examiner* — Yu-Hsi D Sun
*Assistant Examiner* — Christina Sylvia
(74) *Attorney, Agent, or Firm* — Martin I. Finston (57) ABSTRACT

A structured wafer that includes through passages is used for device processing. Each of the through passages extends from or along one surface of the structured wafer and forms a pattern on a top surface area of the structured wafer. The top surface of the structured wafer is bonded to a device layer via a release layer. Devices are processed on the device layer, and are released from the structured wafer using etchant. The through passages within the structured wafer allow the etchant to access the release layer to thereby remove the release layer.

20 Claims, 7 Drawing Sheets

STRUCTURED WAFER FOR DEVICE PROCESSING

GOVERNMENT RIGHTS

This invention was made with Government support under Contract No. DE-AC04-94AL85000 awarded by the U.S. Department of Energy. The Government has certain rights in the invention.

CROSS-REFERENCE TO RELATED APPLICATION

This is a divisional application of U.S. patent application Ser. No. 13/239,181 entitled "STRUCTURED WAFER FOR DEVICE PROCESSING" filed Sep. 21, 2011, which is pending. The entirety of this application is incorporated herein by reference.

FIELD OF THE INVENTION

Semiconductor fabrication; and in particular, to the use of a structured wafer as a handle wafer for device processing.

BACKGROUND

One approach for fabricating semiconductor devices is to process the devices while they are bonded to the top of a handle wafer. After the devices are formed, they are released from the handle wafer with etchants. This etching process usually takes a long time (e.g., 30 minutes to hours). Due to the long etching time, some of the devices that have already been released from the handle wafer may adhere to each other or re-adhere to the handle wafer at the end of the etching process.

In some approaches, silicon handle wafers are used to process silicon-based devices. These handle wafers are typically consumed by the process of growing and forming the devices. Some of the handle wafers need to be destroyed after the release of the devices. Replacing these handle wafers increases the cost of device processing. In some other approaches, silicon devices are processed on handle wafers that are made of metal and/or ceramics. These metal and/or ceramic handle wafers usually do not yield high quality crystalline silicon.

SUMMARY

A method, apparatus and system of a structured wafer for processing devices is disclosed. According to one embodiment, the structured wafer includes through passages that each extend from or along one surface of the structured wafer. The through passages form a pattern on the top surface of the structured wafer. In some embodiments, the through passages can include through holes that extend vertically through the thickness of the structured wafer, surface channels that lie across a top surface of the structured wafer and extend lengthwise on one surface of the structured wafer, or a combination of both. In some embodiments, the structured wafer is reusable for producing multiple batches of devices with any sizes, shapes and functionalities.

In one embodiment, a method is performed to bond a top surface of a structured wafer to a release layer and a device layer. The device layer is processed to produce devices. The release layer is then removed using etchant that accesses the release layer via the through passages to thereby separate the devices from the structured wafer.

In one embodiment, an apparatus includes a structured wafer and a device layer bonded to the top surface of the structured wafer via a release layer. The device layer is to form devices, which are processed while being bonded to the structured wafer and are released from the structured wafer with an etchant that accesses the release layer via the through passages to thereby remove the release layer.

In one embodiment, a system includes a structured wafer and a donor wafer bonded to the top surface of the structured wafer to transfer a device layer and a release layer to the structured wafer. The donor wafer is to be separated from the structured wafer along a plane defined by an internal separation layer within the donor wafer. The system further includes devices that are formed from the device layer. The devices are processed while being bonded to the structured wafer and are released from the structured wafer with an etchant that accesses the release layer via the through passages to thereby remove the release layer.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments provide a structured wafer that includes vertical through holes in a direction perpendicular to the top surface of the wafer, surface channels on the top surface of the wafer and parallel to the top surface of the wafer, or a combination of both. The through holes, surface channels, and the combination thereof herein are collectively referred as "through passages." Each of the through passages extends from or along one surface of the wafer. In the embodiments of through holes, etchant can enter the through holes from the bottom surface of the wafer to reach a release layer that is bonded to the top surface of the wafer. In the embodiments of surface channels, etchant can enter the surface channels from side surfaces of the wafer or in between individual devices to reach the release layer.

In some embodiments, the structured wafer is used as a handle wafer. Thus, in the following description, the term "structured wafer" and "handle wafer" are used interchangeably. In some embodiments, the top surface of the structured wafer can be bonded to a donor wafer, which carries a device layer (on which the devices are formed) and a release layer. The release layer directly contacts the top surface of the structured wafer. The through passages can be accessed by an etchant and increase surface areas of the release layer exposed to the etchant. As a result, the release layer can be etched away within a relatively short time and the processed devices can be released from the structured wafer.

Further, the use of the structured wafer reduces device adhesion near the end of the release process. The through passages reduce the top surface area of the structured wafer that can form direct contact with devices after the release layer is removed. As a result, devices that have been separated from the handle wafer are less likely to re-adhere to the structured wafer when a wet chemical release agent is utilized. In a scenario where a dry release agent (e.g., xenon difluoride ($XeF_2$)) is utilized, the use of the structured wafer can be beneficial in preventing adhesion between released parts until they are removed with, for example, a tape or film based receiving substrate. In some embodiments, the device layer carried by the donor wafer can also be texturized (on the surface to be bonded to the release layer) to further reduce device adhesion at the end of the release process. The textures of the device layer can be random or have a defined property for a specific application; for example, for photovoltaic (PV) cells, the texture can be designed to improve light trapping.

Moreover, the through passages allow the structured wafer to accommodate more stress than a solid wafer during the device processing stage. As the through passages provide spacing on the top surface area of the structured wafer, the structured wafer can accommodate more stress by slightly expanding or shrinking.

Additionally, the arrangement of the through passages in the structured wafer also allows the structured wafer to bond more easily to the donor wafer. During the etching process, certain gas (e.g., hydrogen) may be generated at the surface-to-surface contact ("interface") due to chemical reactions. If the gas is left at this interface, it will migrate and can turn into gas pockets. These gas pockets can become defects, which degrade the structured wafer and the processed devices. The through passages described herein provide a route for the gas such that it can escape the interface.

In some embodiments, a structured wafer can be utilized in fabrication of devices of arbitrary sizes, shapes and functionalities. These devices can be detectors, sensors, PV cells, integrated circuits (ICs), micro-machine parts, micro-mechanical parts, electronic components, or any semiconductor devices. After the devices are released from the structured wafer with a receiving substrate, the devices can be separated from the receiving substrate and re-assembled for a specific configuration, without needing dicing or sawing of the parts.

In some embodiments, after release of the processed devices, the structured wafer can be made available for further reuse. Reusing the structured wafer reduces fabrication and materials costs. This is in contrast to a conventional handle wafer, which is consumed by the process of device fabrication and cannot be reused.

Figure 1A:
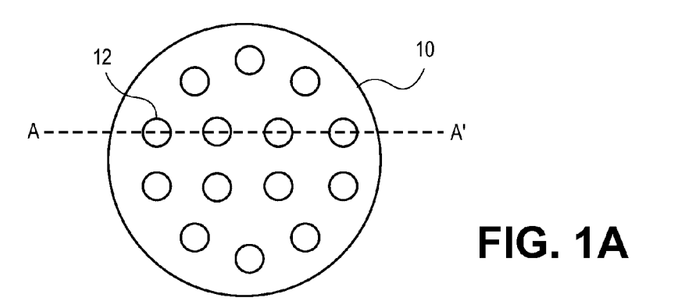
FIG. 1A illustrates a top view of one embodiment of a structured wafer.
Figure 1B:
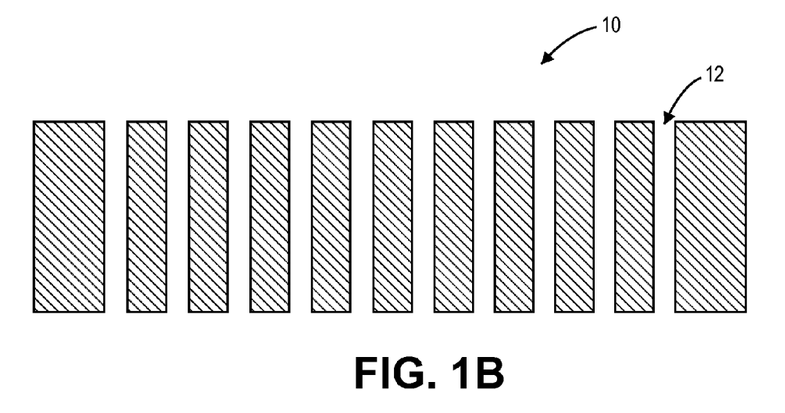
FIG. 1B is a vertical section view of the structured wafer of FIG. 1A.

FIG. 1A is a top view of one embodiment of a structured wafer 10. In this embodiment, structured wafer 10 includes multiple through holes (e.g., holes 12) (not drawn to scale) that form a pattern on the top surface of the structured wafer. FIG. 1B is a vertical section view of structured wafer 10, where the vertical section is defined by the dotted line A-A'. As shown in FIG. 1B, each hole 12 extends vertically through the thickness of structured wafer 10. In one embodiment, holes 12 can be formed with uniform spacing among them, with non-uniform spacing among them, or at random locations. Holes 12 can be of the same size or different sizes (e.g., a diameter in the range of 50-500 microns (um)). In one embodiment, structured wafer 10 is made of silicon or any silicon-based materials. It is appreciated that structured wafer 10 can be single crystalline or polycrystalline silicon. In alternative embodiments, structured wafer 10 can be made of other materials such as ceramic materials. In one embodiment, various additional layers cover the entire surface of structured wafer 10. Structured wafer 10 is illustrated in FIG. 1A with a circular shape similar to conventional 200 mm and 300 mm silicon wafers. It is appreciated that the shape and dimensions of structured wafer 10 will be dictated, in one embodiment, by the requirements of a device layer that will subsequently be adhered to structured wafer 10.

Figure 1C:
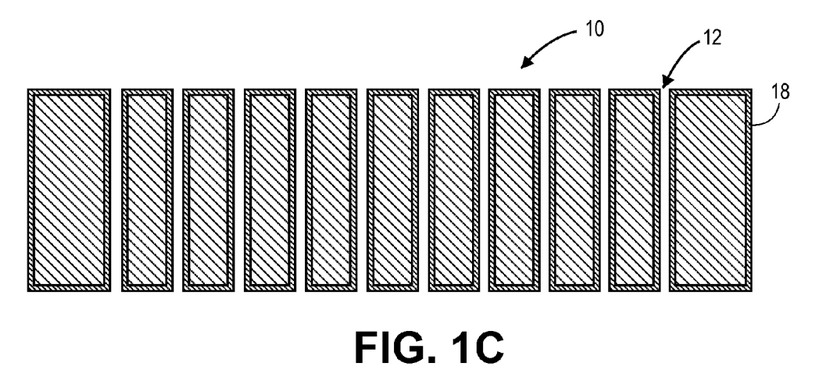
FIG. 1C illustrates the structured wafer of FIG. 1A with a passivation layer.

Structured wafer 10 can be manufactured with standard semiconductor processing techniques. In one embodiment, structured wafer 10 can be formed from a base wafer (e.g., a silicon wafer) with a hard mask deposited thereon. An example of the hard mask is an oxide layer that is patterned to define the size(s) and locations of holes 12. The hard mask exposes the part of the silicon wafer where holes 12 are to be formed. An etchant can then be used to etch through the silicon wafer to form holes 12. The hard mask is removed after holes 12 are formed. A passivation layer 18 (e.g., an oxide layer and/or a nitride layer) is formed on the entire exposed surface (including the inner surfaces of holes 12 (i.e., the surface that defines the passage or lumen)) of structured wafer 10, as shown in FIG. 1C. In one embodiment, passivation layer 18 is a thin layer of silicon dioxide with a thickness in the range of 1000 Å-1 micron. At this point, the structured wafer 10 is ready for receiving a device layer.

Figure 2A:
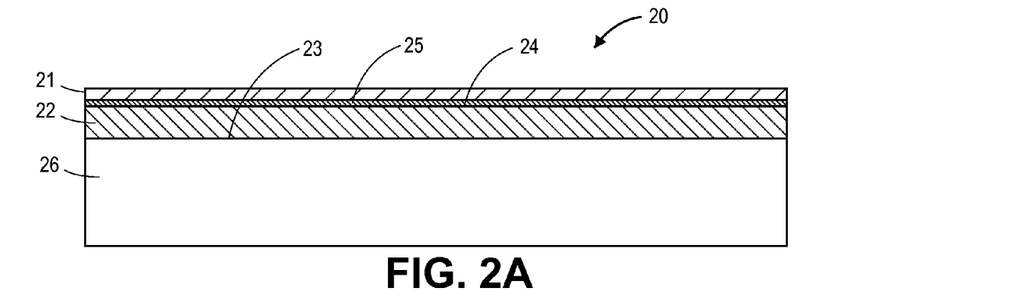
FIG. 2A illustrates one embodiment of a donor wafer.

FIG. 2A illustrates one embodiment of a donor wafer 20 to be bonded to structured wafer 10. Donor wafer 20 includes a substrate 26, which can be made of silicon (Si), gallium arsenide (GaAs), germanium (Ge), or any other materials. That is, donor wafer 20 can be made of a material different from the material of structured wafer 10. In some embodiments, various layers can cover the entire surface of donor wafer 20. In the embodiment of FIG. 2A, a top layer of substrate 26 is to be transferred to structured wafer 10 as a device layer 22 where devices are to be processed and formed. In one embodiment, a top surface 24 (as viewed with the orientation of FIG. 2A) of substrate 26 (which is also the top surface of device layer 22) can be texturized to reduce device adhesion at the end of the release process. The textures (not shown) of device layer 22 can be random or have a defined property for a specific application (e.g., light trapping property for PV cells). Top surface 24 of substrate 26 is then coated with a passivation layer 25 of oxide (e.g., silicon dioxide) and/or nitride. A sacrificial release layer 21 is deposited on top of passivation layer 25. Release layer 21 can be made of amorphous-Si, spin-on glass, or other materials that are different from the material of passivation layer 25 and passivation layer 18. In the embodiment of FIG. 2A, substrate 26 includes an internal separation layer 23, which can be a layer of porous silicon (which is formed inside substrate 26 during an initial preparation process) or an implant-induced cleave layer. The depth of internal separation layer 23 measured from the top of substrate 26 (as viewed in the orientation shown in FIG. 2A) defines the thickness of device layer 22 to be transferred to structured wafer 10. In an embodiment wherein internal separation layer 23 is an implant-induced cleave layer, substrate 26 can be implanted with ions (e.g., hydrogen and/or helium ions) at controlled implantation energy (e.g., 50-500 KeV) such that these ions form a cleave layer at a desired depth within substrate 26.

Device layer 22 carried by donor wafer 20 does not necessarily have sufficient thickness for forming devices; for example, the thickness of device layer 22 may be in the range of 1000 Å-1 um. In this scenario, device layer 22 may be grown epitaxially (e.g., 5-20 um thick) after it is transferred to structured wafer 10. In an alternative embodiment, device layer 22 on donor wafer 20 may already have sufficient thickness (e.g., 5-20 um thick) before the transfer and no further growth is necessary after being bonded to structured wafer 10. In some embodiments to be described below, a device layer can be directly transferred to structured wafer 10 without the use of donor wafer 20.

Figure 2B:
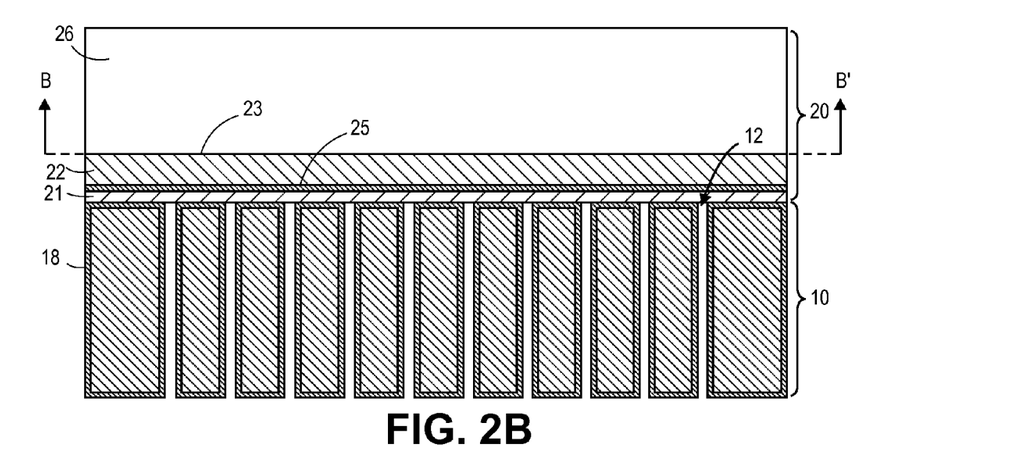
FIG. 2B illustrates an embodiment in which the donor wafer of FIG. 2A is flipped and bonded to the top of the structured wafer of FIG. 1A.
Figure 2C:
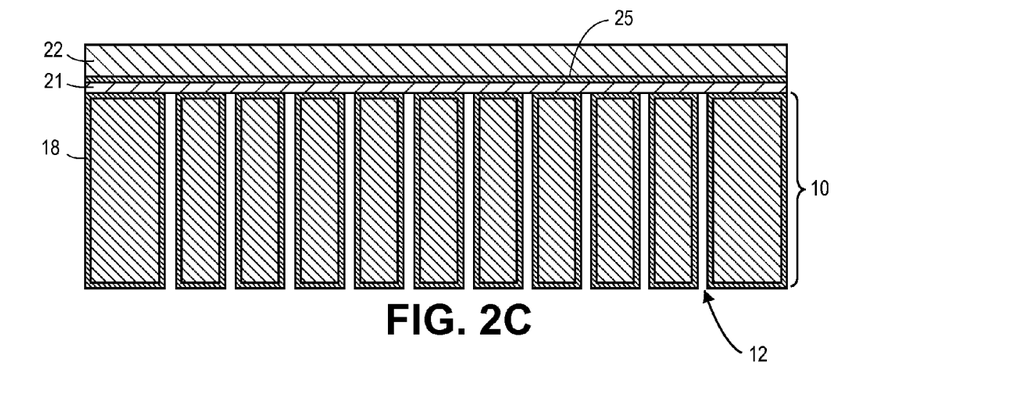
FIG. 2C illustrates an embodiment of the device layer 22, the passivation layer 25, and the release layer 21 bonded to the handle wafer 10 of FIG. 1A after the donor wafer 20 of FIG. 2A is cleaved.

FIG. 2B illustrates an embodiment in which donor wafer 20 of FIG. 2A is flipped and bonded to the top of structured wafer 10. In one embodiment, the bond between donor wafer 20 and structured wafer 10 can be formed by an annealing process. In an embodiment wherein internal separation layer 23 is an implant-induced cleave layer, the surfaces of structured wafer 10 and donor wafer 20 can be hydrogen bonded. Hydrogen bonding is known in the art, and can be performed by cleaning the exposed surfaces, hydrating or hydrogen terminating the surfaces and contacting the surfaces with each other. The bonded wafers can be annealed by heating to a temperature between about 150° and 600° C. to strengthen the bond. In the case where there is an implant induced cleave plane, the annealing causes a fracture or cleaving of donor wafer 20 along the plane (shown as the dotted line B-B') defined by internal separation layer 23. In other embodiments, donor wafer 20 can be separated from structured wafer 10 with a chemical release process (e.g., by etching away internal separation layer 23). After cleaving (or otherwise separating) donor wafer 20, device layer 22 and release layer 21 (as well as passivation layer 25) remain bonded to handle wafer 10. Device layer 22 may be further grown epitaxially after the cleaving if it does not have sufficient thickness for device processing. At the point as shown in FIG. 2C, device layer 22 is ready for forming devices using conventional device processing techniques. Examples of the devices include, but are not limited to, detectors, sensors, PV cells, ICs, micro-machine parts, micro-mechanical parts, electronic components, a combination of any of the above, or other devices specific for a desired application. The devices formed from device layer 22 can be identical to each other. In an alternative embodiment, at least two of the devices can be different from each other. In one example, a device formed from device layer 22 can be an IC integrated with a PV cell as one integrated part. In another example, device layer 22 may include one partition that forms micro-machine parts and another partition that forms PV cells. In yet another example, a PV cell next to an IC control circuit can be formed in the same device layer 22. It is appreciated that device layer 22 can be processed into a variety of devices and device combinations.

In one embodiment (not shown), a passivation layer of oxide and/or nitride is formed during the device process to cover the exposed surfaces of device layer 22. In another embodiment, a passivation layer of oxide and/or nitride is deposited after device layer 22 is processed into devices and this passivation layer will cover the exposed surfaces of the devices.

The process of transferring device layer 22, as described above, allows any material (Si and non-Si materials) to be bonded with a Si wafer and processed using standard Si processing tools. After the transfer of device layer 22 and separation from structured wafer 10, donor wafer 20 may grow back to its original thickness and be reused.

In an alternative embodiment, device layer 22 can be directly transferred to structured wafer 10 without the use of donor wafer 20. That is, no separating or cleaving of donor wafer 20 is necessary. In this alternative embodiment, device layer 22 of sufficient thickness (e.g., 5-20 um) is first coated with passivation layer 25 and release layer 21, and then bonded to structured wafer 10 with plasma surface activation using, for example, argon plasma, nitrogen plasma, oxygen plasma, or the like. Alternatively, device layer 22 with passivation layer 25 can be bonded to structured wafer 10 using other adhesion mechanisms. Release layer 21 can be used as a temporary adhesion layer, which can be etched away after the devices are processed and formed. In one embodiment, this bonded structure can be annealed at a high temperature (e.g., 150-600° C.) to strengthen the bond for further processing.

Figure 3A:
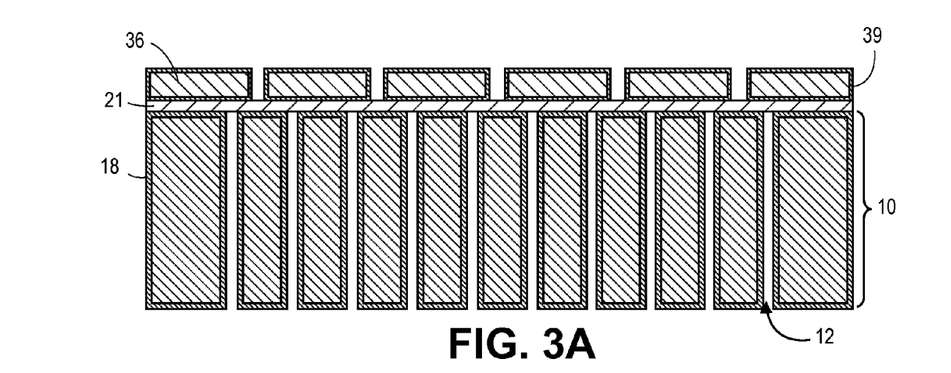
FIGS. 3A-3C illustrate a process in which the structured wafer of FIG. 1A serves as a reusable handle wafer according to one embodiment of the invention.
Figure 3B:
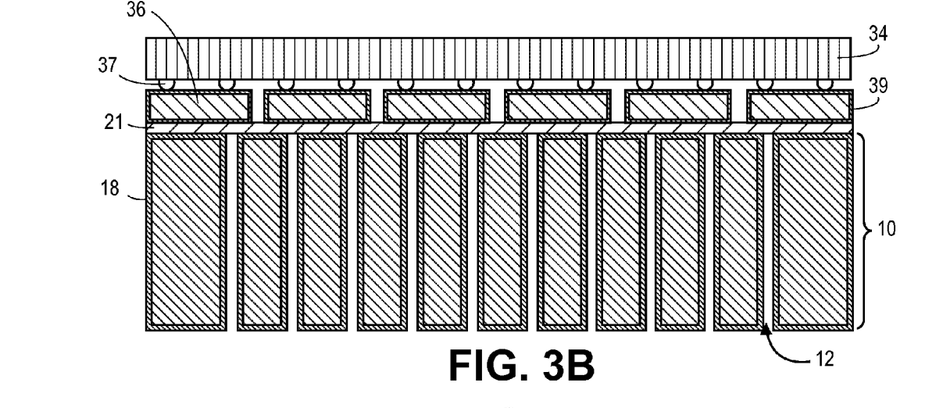
Figure 3C:
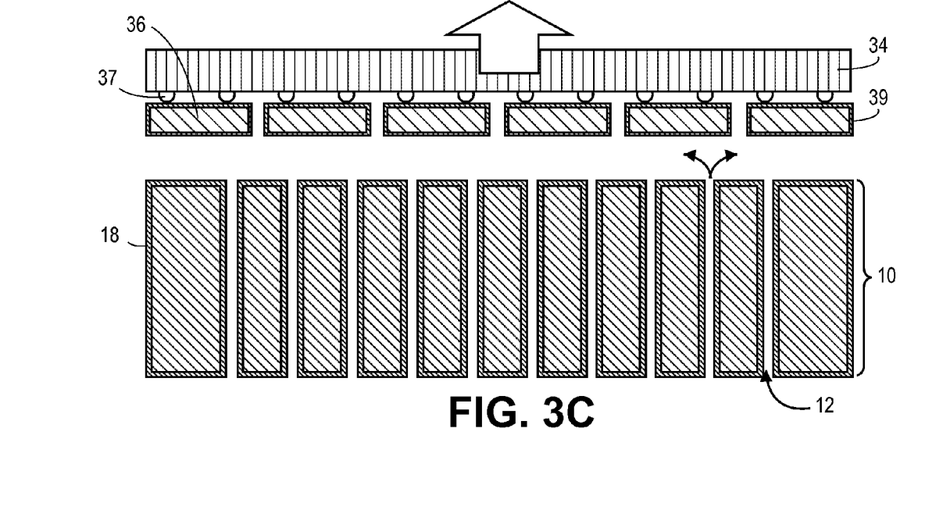

FIGS. 3A-3C illustrate a process in which structured wafer 10 serves as handle wafer for processing devices according to one embodiment of the invention. Referring to FIG. 3A, device layer 22 can be processed to form devices 36 using conventional device processing techniques. Devices 36 can be formed from device layer 22, or alternatively, on device layer 22. After devices 36 are processed and formed, a passivation layer 39 of oxide and/or nitride is formed to cover and surround the surfaces of each device 36. The portion of passivation layer 39 between devices 36 and release layer 21 can include part of passivation layer 25 that was formed earlier and shown in FIGS. 2A, 2B and 2C. Passivation layer 39 serves as a protection layer during a release process to be described below.

In one embodiment, electrical contacts 37 (e.g., solders) can be formed on each device 36 to connect devices 36 with a final receiving substrate 34, as shown in FIG. 3B. Receiving substrate 39 can be a temporary handle (e.g., a tape) or a final assembly substrate. At the end of device processing, release layer 21 is etched away to release devices 36, as shown in FIG.

3C. In one embodiment, chemical etch (e.g., wet etch or plasma etch) is used to remove release layer 21. In one embodiment, xenon difluoride ($XeF_2$) can be used as an etchant. Since structured wafer 10 and devices 36 have passivation layers 18 and 39 all around their surfaces, they are not affected by the etchant. Only release layer 21 is exposed to the etchant and will be etched away. The presence of holes 12 allows the etchant to reach release layer 21 from its bottom surface, in addition to its exposed side/edge surfaces. As a result, the release process can be accelerated.

It should be understood that the choice of chemical composition of the passivation layers described above (e.g., passivation layers 18, 25 and 39) is dependent on the chemical composition of release layer 21. In an embodiment where release layer 21 is made of spin-on glass or amorphous-Si, passivation layers 18, 25 and 39 can be made of oxide. In an embodiment where release layer 21 is made of oxide, passivation layers 18, 25 and 39 can be made of amorphous-Si or Si-nitrite.

In one embodiment, after devices 36 are released, structured wafer 10 can be cleaned for reuse. Passivation layer 18 that is present on structured wafer 10 can be refreshed (re-grown) after a number of uses (e.g., 5-10 uses) to prevent build-up of defects and impurities. If additional silicon growth is needed, an epitaxial silicon growth process can add several microns of silicon before the refreshing of passivation layer 18.

A structured wafer having through holes has been described. In the following, a structured wafer having surface channels is described.

Figure 4A:
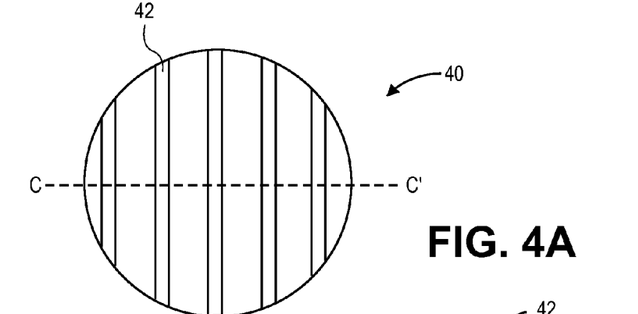
FIG. 4A illustrates a top view of another embodiment of a structured wafer.
Figure 4B:
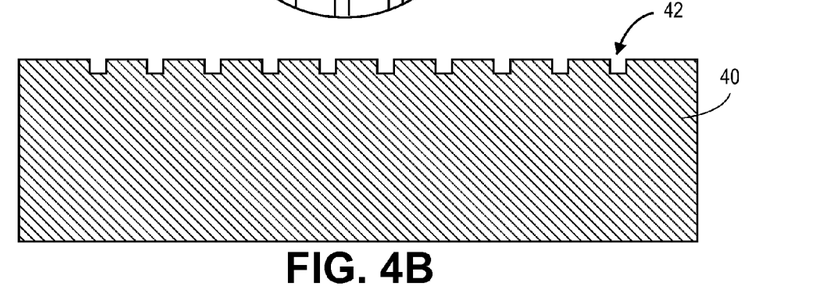
FIG. 4B is a vertical section view of the structured wafer of FIG. 4A.

FIG. 4A illustrates a top view of another embodiment of a structured wafer 40. Structured wafer 40 includes a number of surface channels (e.g., channels 42) (not drawn to scale) that form a pattern on the top surface of the structured wafer. Each channel 42 lies across the top surface of structured wafer 40 and extends lengthwise on one surface of structured wafer 40. In one embodiment, each channel 42 extends lengthwise from one side surface (i.e., an edge) to the opposite side surface (i.e., the opposite edge) of structured wafer 40. In an alternative embodiment, each channel 42 extends lengthwise on the top surface but the extension stops before reaching an edge of structured wafer 40. In yet another embodiment, some of channels 42 may extend from edge to edge and some of channels 42 do not extend from edge to edge. FIG. 4B shows a vertical section view of structured wafer 40, where the vertical section is defined by the dotted line C-C'. In one embodiment, channels 42 can be formed with uniform spacing among them, with non-uniform spacing among them, or at random locations. Channels 42 can be of the same size or different sizes (e.g., a width in the range of 1000 Å-100 microns and a depth in the range of 1000 Å-100 microns). In one embodiment, structured wafer 40 is made of silicon or any silicon-based materials. It is appreciated that structured wafer 40 can be single crystalline or polycrystalline silicon. In alternative embodiments, structured wafer 40 can be made of other materials such as ceramic materials. In one embodiment, various additional layers cover the entire surface of structure layer 40.

Similar to structured wafer 10, structured wafer 40 is illustrated in FIG. 4A with a circular shape similar to conventional 200 mm and 300 mm silicon wafers. It is appreciated that the shape and dimensions of structured wafer 40 will be dictated, in one embodiment, by the requirements of a device layer that will subsequently be adhered to structured wafer 40.

Figure 4C:
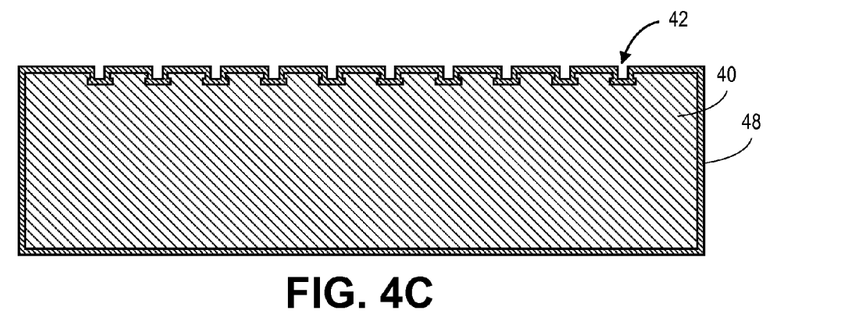
FIG. 4C illustrates the structured wafer of FIG. 4A with a passivation layer.

Similar to structured wafer 10, structured wafer 40 can be manufactured with standard semiconductor processing techniques. In one embodiment, structured wafer 40 can be formed from a base wafer (e.g., a silicon wafer) with a hard mask deposited thereon. An example of the hard mask is an oxide layer that is patterned to define the size(s) and locations of channels 42. The hard mask exposes the part of the silicon wafer where channels 42 are to be formed. An etchant can then be used to etch the silicon wafer to form channels 42 with a specific depth. The hard mask is removed after channels 42 are formed. A passivation layer 48 (e.g., an oxide layer and/or a nitride layer) is then formed on the entire exposed surface (including the inner surfaces of channels 42) of structured wafer 40, as shown in FIG. 4C. In one embodiment, passivation layer 48 is a thin layer of silicon dioxide with a thickness in the range of 1000 Å-1 micron (um). At this point, the structured wafer 40 is ready for receiving a device layer.

Figure 5:
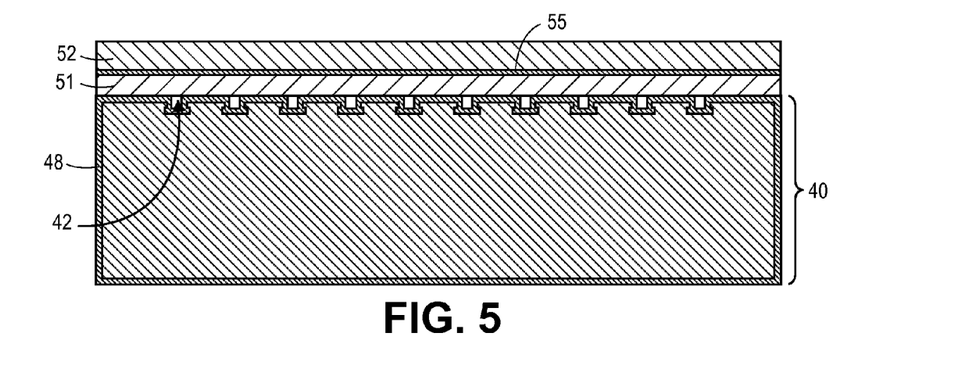
FIG. 5 illustrate the structured wafer of FIG. 4A bonded to a release layer and a device layer.

FIG. 5 illustrates structured wafer 40 bonded to a release layer 51 and a device layer 52. Between release layer 51 and device layer 52 is a passivation layer 55 of oxide and/or nitride. Release layer 51, device layer 52 and passivation layer 55 can be transferred from a donor wafer in a similar process as mentioned above with respect to structured wafer 10. In one embodiment, device layer 52 can be grown epitaxially after it is transferred to structured wafer 40.

Figure 6A:
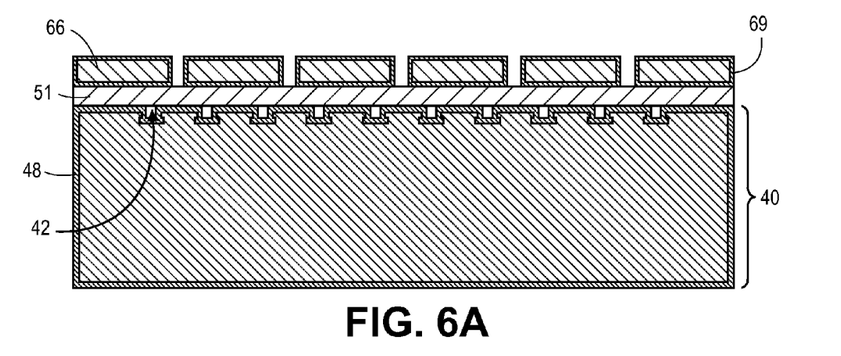
FIGS. 6A-6C illustrate a process in which the structured wafer of FIG. 4A serves as a reusable handle wafer according to one embodiment of the invention.
Figure 6B:
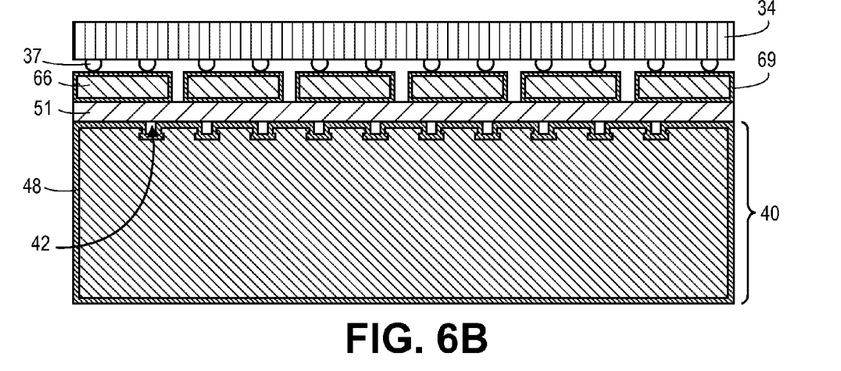
Figure 6C:
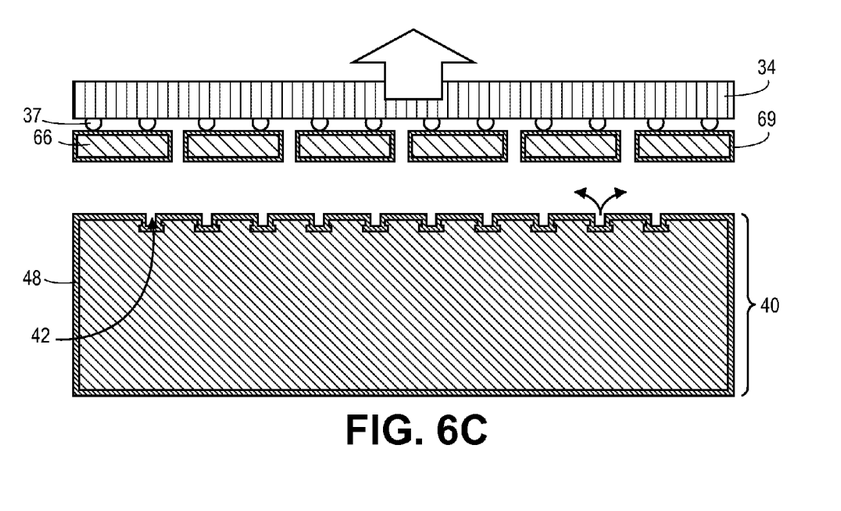

FIGS. 6A-6C illustrate a process in which structured wafer 40 serves as a handle wafer for processing devices 66 according to one embodiment of the invention. After devices 66 are processed and formed, a passivation layer 69 of oxide and/or nitride is formed to cover and surround the surfaces of each device 66. The portion of passivation layer 69 between devices 66 and release layer 51 can include part of passivation layer 55 that was formed earlier and shown in FIG. 5. Passivation layer 69 together with passivation layer 48 serve as a protection layer during the release process. The release process of FIGS. 6A-6C is similar to the corresponding release process of FIGS. 3A-3C and, therefore, will not be repeated herein.

Similar to structured wafer 10, structured wafer 40 can be cleaned for reuse after devices 66 are released. Passivation layer 48 that is present on structured wafer 10 can be refreshed (re-grown) after a number of uses (e.g., 5-10 uses) to prevent build-up of defects and impurities. If additional silicon growth is needed, an epitaxial silicon growth process can add several microns of silicon before the refreshing of passivation layer 48.

Figure 7A:
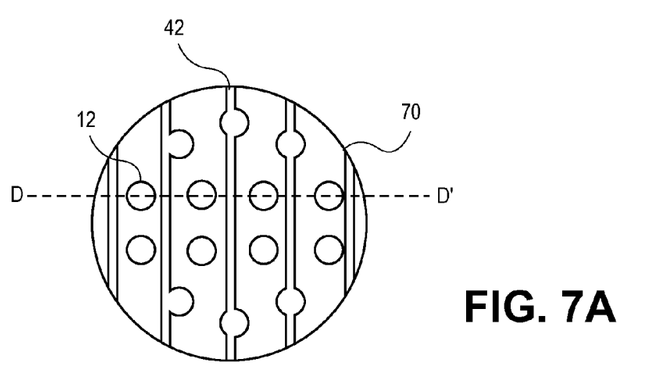
FIG. 7A illustrates a top view of yet another embodiment of a structured wafer.
Figure 7B:
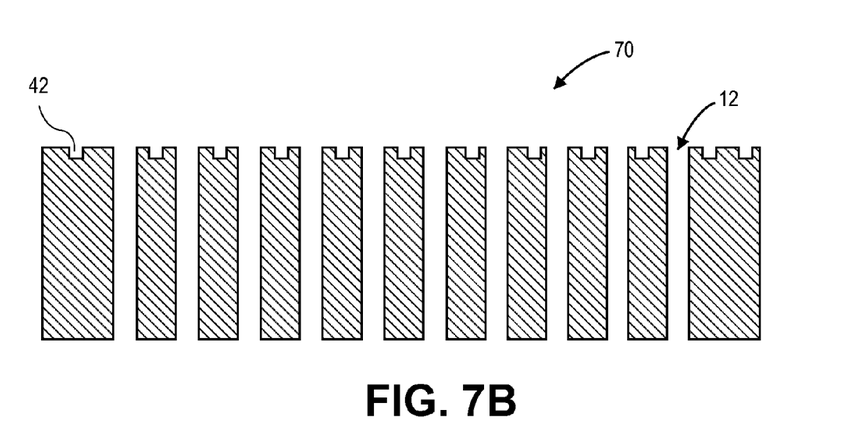
FIG. 7B is a vertical section view of the structured wafer of FIG. 7A.

FIG. 7A illustrates a top view of yet another embodiment of a structured wafer 70. Structured wafer 70 includes a combination of through holes (holes 12 of FIG. 1A) and surface channels (e.g., channels 42 of FIG. 4A) (both of the though holes and surface channels are not drawn to scale). The relative positions of holes 12 and channels 42 can be random, or form an interleaving pattern (in which each channel 42 is between holes 12), or any other uniform or non-uniform patterns. FIG. 7B shows a vertical section view of structured wafer 70, where the vertical section is defined by the dotted line D-D'. The ranges of dimensions of positions of holes 12 and channels 42 can be the same as described above in connection with the embodiments of FIG. 1A and FIG. 4A. The device processing operations of structured wafer 70 can be the same as that of structured wafer 10 of FIG. 1A and structured wafer 40 of FIG. 4A. Similar to structured wafer 10 and structured wafer 40, structured wafer 70 is also reusable.

Figure 8:
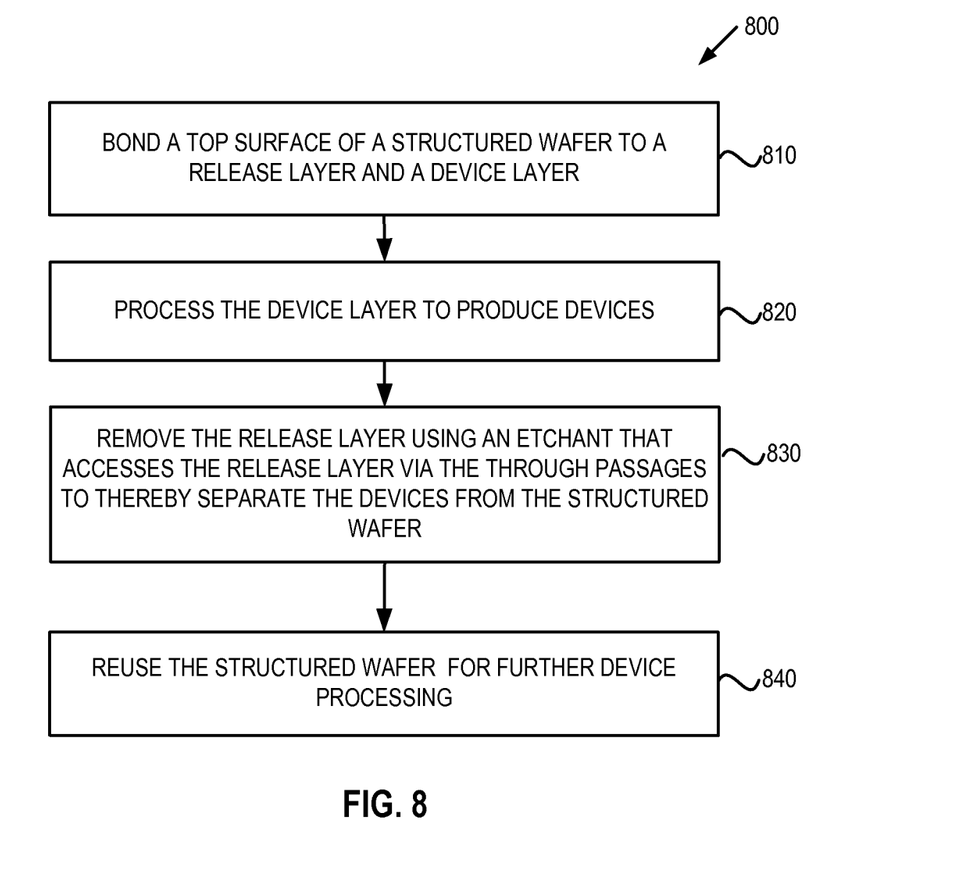
FIG. 8 is a flow diagram of one embodiment of a method of processing devices on a structured wafer.

FIG. 8 is a flow diagram of one embodiment of a method 800 for fabricating devices on a structured wafer (e.g., structured wafer 10 of FIG. 1A, structured wafer 40 of FIG. 4A, or structured wafer 70 of FIG. 7A). The structured wafer includes through passages that each extend from or along one surface of the structured wafer. In one embodiment, a top surface of a structured wafer is bonded to a release layer and a device layer (block 810). The device layer is processed to produce devices (block 820). The release layer is removed using an etchant that accesses the release layer via the through passages to thereby separate the devices from the structured wafer (block 830). In some embodiments, after removal of the release layer, the structured wafer can be reused for further device processing (block 840).

In one embodiment, devices 36 (FIGS. 3A-3C) and/or devices 66 (FIGS. 6A-6C) are PV cells. In this embodiment, the device layer transferred from a donor wafer can be a thin (e.g., 1000 Å-1 um) layer of silicon. After being transferred onto the structured wafer, this thin layer of silicon is used as the seed for further epitaxial growth into a desired thickness (e.g., 5-20 um). As both this thin layer and the structured wafer are made of silicon, problems with dissimilar materials (such as mismatches in expansion coefficients, impurities, etc.) can be avoided. Further, this approach bypasses the highest energy input and highest cost process of the conventional PV manufacturing cycle, which includes polysilicon growth, Czochralski (CZ) wafer pull or ingot casting, and wafer sawing. Therefore, the cost of PV manufacturing can be greatly reduced.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    bonding a top surface of a structured wafer to a release layer and a device layer, the structured wafer comprising a plurality of through passages that each extend from or along one surface of the structured wafer to the top surface of the structured wafer, wherein the plurality of through passages do not define side edges of the structured wafer that extend from the top surface to the one surface of the structured wafer;
    processing the device layer to produce a plurality of devices; and
    removing the release layer using an etchant that accesses the release layer via the plurality of through passages to thereby separate the devices from the structured wafer.

2. The method of claim 1, further comprising:
    growing the device layer to increase the thickness of the device layer after the donor wafer is bonded to the structured wafer.

3. The method of claim 1, further comprising:
    forming a first passivation layer on surfaces of each of the devices; and
    forming a second passivation layer on outer surfaces of the structured wafer and inner surfaces of the through passages.

4. The method of claim 1, further comprising:
    texturizing a surface of the device layer before forming the release layer on the donor wafer.

5. The method of claim 1, further comprising:
    separating the donor wafer from the structured wafer along a plane defined by an internal separation layer within the donor wafer.

6. The method of claim 1, wherein each of the through passages comprises a through hole that extends vertically through the thickness of the structured wafer.

7. The method of claim 1, wherein each of the through passages comprises a surface channel that lies across a top surface of the structured wafer and extends lengthwise on the one surface of the structured wafer.

8. The method of claim 1, wherein the through passages comprises a combination of a through holes and surface channels, wherein each of the through holes extends vertically through the thickness of the structured wafer and each of the surface channels extends lengthwise on the one surface of the structured wafer.

9. The method of claim 1, further comprising:
    after removing the release layer, reusing the structured wafer to produce additional plurality of devices.

10. A method comprising:
    etching a through hole that extends through a width of a structured wafer, from a top surface of the structured wafer to a bottom surface of the structured wafer, wherein the through hole does not define a side edge of the structured wafer;
    bonding the top surface of the structured wafer to a release layer of a donor wafer, wherein the donor wafer further comprises a device layer;
    forming a device from the device layer of the donor wafer while the donor wafer is bonded to the structured wafer; and
    etching the release layer of the donor wafer, at least in part through the through hole in the structured wafer, to release the device from the structured wafer.

11. The method of claim 10, further comprising:
    etching a surface channel in the top surface of the structured wafer in the form of a trough parallel to the top surface of the structured wafer, wherein the etching of the release layer of the donor wafer is additionally at least in part through the surface channel in the top surface of the structured wafer.

12. The method of claim 11, wherein the through hole overlaps with the surface channel.

13. The method of claim 11, wherein the surface channel is etched from one point of the side edge of the structured wafer to another point of the side edge of the structured wafer.

14. The method of claim 11, wherein a depth of the surface channel is less than 100 microns.

15. The method of claim 10, wherein a width of the through hole is less than 500 microns.

16. The method of claim 10, further comprising:
    etching additional through holes in the structured wafer.

17. The method of claim 16, wherein the etching of the release layer of the donor wafer is at least in part through the additional through holes of in the structured wafer.

18. The method of claim 10, wherein the device is a semiconductor device.

19. The method of claim 10, further comprising:
    after the release of the device from the structured wafer, cleaning the structured wafer; and
    reusing the cleaned structured wafer in a fabrication process.

20. A method comprising:
    etching a through hole that extends through a width of a structured wafer, from a top surface of the structured wafer to a bottom surface of the structured wafer, wherein the through hole does not define a side edge of the structured wafer;
    bonding the top surface of the structured wafer to a device layer coated with a passivation layer and release layer using plasma surface activation;
    forming a device from the device layer while the device layer is bonded to the structured wafer; and etching the release layer away to release the device from the structured wafer.

* * * * *